(12) United States Patent
Fitt et al.

(10) Patent No.: US 9,976,446 B2
(45) Date of Patent: May 22, 2018

(54) ELECTRICAL PANEL

(71) Applicant: ROLLS-ROYCE PLC, London (GB)

(72) Inventors: Matthew Peter Fitt, Attleborough (GB); Oliver George Feaver, Louth (GB)

(73) Assignee: ROLLS-ROYCE plc, London (GB)

( * ) Notice: Subject to any disclaimer, the term of this patent is extended or adjusted under 35 U.S.C. 154(b) by 523 days.

(21) Appl. No.: 14/830,154

(22) Filed: Aug. 19, 2015

(65) Prior Publication Data

US 2016/0069213 A1 Mar. 10, 2016

(30) Foreign Application Priority Data

Sep. 10, 2014 (GB) .................................. 1416012.1

(51) Int. Cl.
| | |
|---|---|
| *H05K 1/00* | (2006.01) |
| *F01D 25/24* | (2006.01) |
| *F01D 25/00* | (2006.01) |
| *F02C 7/00* | (2006.01) |
| *H05K 3/00* | (2006.01) |
| *H05K 3/10* | (2006.01) |
| *H05K 1/03* | (2006.01) |
| *H05K 3/28* | (2006.01) |

(52) U.S. Cl.
CPC ............ *F01D 25/24* (2013.01); *F01D 25/00* (2013.01); *F02C 7/00* (2013.01); *H05K 3/0058* (2013.01); *H05K 3/103* (2013.01); *F05D 2300/603* (2013.01); *H05K 1/0393* (2013.01); *H05K 3/28* (2013.01); *Y02T 50/672* (2013.01)

(58) Field of Classification Search
CPC . F01D 25/24; F01D 25/00; F02C 7/00; F05D 2300/603; H05K 1/0393; H05K 3/0058; H05K 3/103; H05K 3/28; Y02T 50/672
USPC .......................................................... 174/250
See application file for complete search history.

(56) References Cited

U.S. PATENT DOCUMENTS

| | | |
|---|---|---|
| 3,128,214 A | 4/1964 | Lay |
| 4,311,749 A | 1/1982 | Hiraiwa et al. |
| 2013/0111872 A1 | 5/2013 | Young et al. |
| 2013/0160291 A1* | 6/2013 | Broughton ................ F02C 7/32 29/888.021 |

(Continued)

FOREIGN PATENT DOCUMENTS

| | | |
|---|---|---|
| EP | 2 437 363 A1 | 4/2012 |
| EP | 2 733 330 A2 | 5/2014 |

(Continued)

OTHER PUBLICATIONS

Jan. 27, 2016 Search Report issued in European Patent Application No. 15181371.

(Continued)

Primary Examiner — Sherman Ng
(74) Attorney, Agent, or Firm — Oliff PLC

(57) ABSTRACT

A rigid panel is disclosed which has elongate elements embedded therein. The elongate elements may be electrical wires. The rigid panel has a supporting splint embedded therein which is placed between the elongate elements and a rigid structural layer so as to provide protection to the rigid structural layer from the effects of the elongate elements.

19 Claims, 5 Drawing Sheets

(56) References Cited

U.S. PATENT DOCUMENTS

2013/0160458 A1* 6/2013 Willmot .................. F02C 7/12
　　　　　　　　　　　　　　　　　　　　　　　　60/783
2013/0161093 A1　6/2013 Broughton et al.
2014/0186586 A1　7/2014 Victorazzo

FOREIGN PATENT DOCUMENTS

EP　　2 743 477 A1　6/2014
EP　　2 946 925 A1　11/2015

OTHER PUBLICATIONS

Jul. 14, 2015 Search Report issued in GB Patent Application No. 1416012.1.

* cited by examiner

ELECTRICAL PANEL

CROSS-REFERENCE TO RELATED APPLICATIONS

This application is based upon and claims the benefit of priority from British Patent Application Number 1416012.1 filed 10 Sep. 2014, the entire contents of which are incorporated by reference.

BACKGROUND

1. Field of the Disclosure

The present disclosure relates to embedding elongate elements in a rigid panel. Aspects of the present disclosure relate to methods of manufacturing such a panel.

Aspects of the present disclosure relate to a rigid panel for an electrical system, for example an electrical system of a gas turbine engine.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed. The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

OBJECTS AND SUMMARY

It is proposed to replace at least some conventional engine ancillaries (commonly referred to as engine dressings) with rigid panels. For example, at least a part of a conventional harness may be replaced with a rigid panel having electrical conductors embedded therein. It is important that the structural properties of the rigid panels are retained throughout manufacture and use.

According to an aspect, there is provided a rigid panel comprising a rigid structural layer. The rigid panel comprises at least one elongate element. The rigid panel comprises a supporting splint positioned between the rigid structural layer and the at least one elongate element. The rigid panel comprises a covering layer positioned over the at least one elongate element such that the at least one elongate element and the supporting splint are sandwiched between the rigid structural layer and the covering layer.

The or each at least one elongate element (in whatever form it or they may take) and/or the supporting splint may be said to be embedded in the rigid panel.

According to an aspect, there is provided a method of manufacturing a rigid panel (such as a rigid electrical panel) as described and/or claimed herein for example. The method comprises: providing an uncured organic matrix composite layer; laying a supporting splint on top of the uncured organic matrix composite layer; and laying at least one elongate element on top of the supporting splint. The method comprises covering at least the supporting splint and the at least one elongate element with a covering layer so as to sandwich the supporting splint and the at least one elongate element between the uncured organic matrix composite and the covering layer. The method comprises curing the uncured organic matrix composite to form a rigid structural layer. The curing step may be provided before or after providing the covering layer. The covering layer may (or may not) also be cured during the curing step.

The rigid panels and/or methods of manufacturing rigid panel described and/or claimed herein may provide panels that have particularly good structural properties. For example, the presence of the splint may allow any damage and/or deformation of the structural layer that may be caused by the elongate element(s) during manufacture and/or use to be reduced, for example substantially eliminated. The elongate elements may generate significant pressure on the surfaces on which they bear, for example due to their shape. Such pressure may be damaging, for example to the structural layer, for example during manufacture. The supporting splint may act to spread the load, or reduce the pressure, of the elongate elements acting on the structural layer, for example during manufacture. The supporting splint may therefore allow a rigid panel to have desired structural properties, for example at a weight that may be lower than that which would be required in order to achieve such properties in the absence of the supporting splint. The supporting splint may provide a stable and robust platform on which to provide the elongate elements, which may ensure reliable and safe operation of the panel, for example over time.

At least one of the at least one elongate elements may comprise an electrically conductive wire. Such a wire may be insulated, for example by being surrounded by an insulator. Such a rigid panel comprising an electrically conductive wire may be referred to as a rigid electrical panel. Electrical signals may be carried through (for example into and/or out of and/or along) the rigid panel by such an electrically conductive wire.

Reference is made throughout the present disclosure to the elongate elements comprising electrically conductive wires. However, it will be appreciated that rigid panels may comprise other elongate elements, in addition to or instead of electrical wires. Purely by way of example, a rigid panel may comprise fire detection tubes. Such fire detection tubes may be hollow tubes that are pressurized, such that any temperature change (for example due to fire) can be detected. Other fire detection tubes that may be used in the panel may experience changes in capacitance and/or inductance as a result of temperature change.

By way of further example, at least one of the at least one elongate elements may be a pipe, for example a pipe that is configured to carry a fluid (including a liquid or gas). A rigid panel may comprise more than one type of elongate element. For example, a rigid panel may comprise a pipe as well as an electrical wire.

The properties of the supporting splint, for example its stiffness, may be carefully selected in order to provide sufficient protection to the structural layer that is used in the panel. The supporting splint may be sufficiently rigid to substantially prevent local deformation being caused by the or each elongate element during manufacture. For example, the supporting splint may be sufficiently rigid to substantially prevent local deformation being caused by the or each elongate element during the conditions of a curing cycle. This may be particularly beneficial where part of the manufacture of the panel involves curing, for example if the structural layer requires curing. Such curing may involve elevated temperature and/or pressure, which may result in the structural layer becoming vulnerable to damage during curing, for example from the elongate elements. The supporting splint may provide particularly effective protection in such situations.

The supporting splint may be sufficiently flexible that it is able to follow the shape of the rigid structural layer. Accordingly, the supporting splint may be able to provide protection to the structural layer whilst conforming to the desired shape of the rigid panel. The supporting splint may be a thin body, having upper and lower major surfaces separated by a thickness. The supporting splint may exhibit sufficient flexibility about axes aligned with the upper and/or lower major surfaces to allow it to follow the shape of the rigid structural layer.

The rigid panel may comprise a flexible printed circuit, which may be sandwiched between the rigid structural layer and the covering layer. Such a flexible printed circuit may be said to be embedded in the rigid panel. A rigid panel comprising a flexible printed circuit may be referred to as a rigid electrical panel. Electrical signals may be carried through (for example into and/or out of and/or along) the rigid panel by such a flexible printed circuit.

The supporting splint may be made from any suitable material. For example, the supporting splint may be laid onto the structural layer as a pre-cured (i.e. already cured) organic matrix composite or plastic. The supporting splint may retain substantially all of its stiffness during manufacture of the rigid panel, for example during curing of the structural layer. The supporting splint and the rigid structural layer may be different materials.

The supporting splint may be a flexible printed circuit. Thus, the supporting splint may be able to carry electrical signals through the rigid panel. An embedded flexible printed circuit may be said to be placed between the structural layer and the elongate elements, thereby providing the advantages described herein in relation to the supporting splint.

At least one elongate element may be fire resistant. By way of example, the term fire resistant may be taken to mean that the elongate element (for example electrical wire) may survive (for example be able to operate to its design intent, for example be able to reliably transfer electrical signals) at temperatures of up to 1100° C. for at least 15 minutes.

The at least one elongate element may be more fire resistant than a flexible printed circuit. For example, where the elongate element comprises an electrical wire and the rigid panel comprises a flexible printed circuit, the electrical wire may be more fire resistant than the flexible printed circuit. Thus, signals passing along the electrical wire may be better protected from fire than signals passing along conductors in the flexible printed circuit.

The at least one elongate element may be more fire resistant than the rest of the rigid panel.

The rigid structural layer of the rigid panel may comprise an organic matrix composite. Purely by way of example, the organic matrix composite may be a carbon fibre composite or a glass fibre composite. Such a composite may require curing during manufacture in order to achieve the desired mechanical properties. As noted elsewhere herein, the supporting splint may be particularly effective at providing protection to the structural layer during curing. The supporting splint may provide protection to a composite layer during manufacture to ensure that fibres in the composite layer remain aligned in the intended direction. Without the supporting splint, the fibres may become misaligned, for example during a curing operation. This may be caused by the elongate elements pressing into and/or indenting the structural material, which may displace the fibres, during curing. In this regard, the elevated temperatures and/or pressures of a curing process may result in the structural layer becoming particularly susceptible to deformation, and thus damage. The effectiveness of the fibres, for example in terms of the structural properties (such as strength and/or rigidity) that they provide to the panel, may be compromised if they are displaced from their intended position and/or alignment.

The rigid structural layer may be manufactured using and/or comprise ply layers, for example ply layers of organic matrix composite. Any fibres provided in such ply layers may be specifically designed to be aligned and/or oriented in a particular manner (or pattern) in order to provide the desired structural properties of the panel. The arrangement described and/or claimed herein may be particularly effective at preserving this intended alignment.

A rigid panel as described and/or claimed herein may be for use as part of an electrical system, for example for a gas turbine engine and/or a vehicle. Such a rigid panel for use as part of an electrical system would comprise electrical conductors (which may be described as being embedded in the panel), and thus may be referred to as a rigid electrical panel. The electrical conductors may be in the form of electrical wires (which may form part of the elongate elements of the panel) and/or or a flexible printed circuit (which may or may not form the supporting splint).

A rigid electrical panel may comprise both one or more electrical wires (which may be insulated and/or may be the elongate elements) and one or more flexible printed circuits. In such an arrangement, the insulated wires may be arranged to carry electrical signals that are required to continue to operate in the event of a fire. Such signals may be described as critical signals. Thus, the electrical wires may be arranged to carry critical signals. Such signals may be required for the functioning of safety systems and/or backup systems in the event of a fire. The electrical wires may be better able to withstand fire than the flexible printed circuit. Electrical signals carried by the electrical wires may continue to operate during a fire for longer than electrical signals carried by the flexible printed circuit.

According to an aspect, there is provided a rigid electrical panel for a gas turbine engine. The rigid electrical panel comprises a rigid structural layer. The rigid electrical panel comprises at least one electrically conductive wire, the or each electrically conductive wire being configured to carry one of a first set of electrical signals associated with the operation of the gas turbine engine. The rigid electrical panel comprises at least one flexible printed circuit, the or each flexible printed circuit comprising electrical conductors configured to carry a second set of electrical signals associated with the operation of the gas turbine engine. The rigid electrical panel comprises a covering layer. The at least one electrically conductive wire and the at least one flexible printed circuit are sandwiched between the rigid structural layer and the covering layer. The or each electrically conductive wire is provided with better fire resistance than the electrical conductors of the or each flexible printed circuit. The or each electrically conductive wire may be provided with an insulating layer (which may be referred to as a protective layer) that provides fire resistance. The electrically conductive wire may be able to continue to carry electrical signals (for example from the first set of electrical signals) for longer than the electrical conductors of the flexible printed circuit in the event of a fire and/or may be able to continue to carry electrical signals at higher temperatures (for example when the rigid electrical panel is exposed to higher temperatures).

The first set of electrical signals may be critical to safe engine operation. This may mean, for example, that the first set of electrical signals are those that are required to continue to be transmitted in the event of a fire, at least up to fire regulation requirements. The second set of electrical signals may not be required to meet such requirements.

Each of the first set of electrical signals may be carried by an electrically conductive wire. The flexible printed circuits may only carry electrical signals from the second set of electrical signals.

At least one of the at least one flexible printed circuits may be positioned between the or each electrically conductive wire and the rigid structural layer. This may provide protection to the rigid structural layer from the electrically conductive wires, for example as described elsewhere herein, for example to prevent damage to the rigid structural layer, for example during manufacture (which may include a curing step) and/or normal use.

According to an aspect, there is provided a gas turbine engine and/or a vehicle comprising a rigid panel (including a rigid electrical panel) as described and/or claimed herein. The rigid panel may be a rigid electrical panel that is part of an electrical system (such as an electrical harness) of the vehicle/gas turbine engine.

Any rigid panel or rigid electrical panel may be referred to herein as a panel, a raft, a rigid raft, an electrical panel, an electrical raft, a rigid electrical raft. Where the term "electrical" is used with reference to a panel or raft, this may mean that the panel or raft comprises at least one embedded electrical conductor, which may be in the form of a flexible printed circuit and/or a wire, for example. The terms listed above may be considered to be interchangeable as used herein, and so, for example, any feature described in relation to an electrical raft, a rigid raft, a rigid electrical raft, a panel or a raft (or assemblies thereof) may, of course, apply to a rigid panel and/or a rigid electrical panel. Any feature described in relation to a rigid panel may apply to a rigid electrical panel and vice versa. Furthermore, an electrical panel/raft may be at least a part of an electrical harness for a gas turbine engine, and thus may be referred to herein as an electrical harness raft or electrical harness panel.

In any arrangement described and/or claimed herein, the rigid panel (including, as always, a rigid electrical panel) may comprise (and/or be provided with) at least one passage in the rigid material. The or each passage may be for passing a fluid therethrough in use. The fluid passage may be part of a fluid system, such as a gas (for example pneumatic or cooling gas/air) and/or liquid (for example a fuel, hydraulic and/or lubricant liquid). A rigid electrical panel may be able both to transmit electrical signals/power and carry fluids, for example around a gas turbine engine. Accordingly, the single panel may be able to replace both fluid pipes and individual electrical wires of conventional fluid and electrical systems of a gas turbine engine.

An rigid panel may be formed in any desired shape, for example in a shape that corresponds to the shape of a casing of a gas turbine engine, such as a fan case, a compressor case, or a turbine case. In this regard, the term "corresponds to" may mean, for example, that the shape of the electrical panel is an offset shape from the shape of the casing.

A rigid panel may be provided in any suitable location/position of a gas turbine engine. For example, the gas turbine engine may comprise a bypass flow duct formed between an engine core and an engine fan casing (the gas turbine engine may be a turbofan engine, for example); and the rigid panel may form at least a part of a radially extending splitter (which may be referred to as a bifurcation) that extends across the bypass flow duct. In this way, an rigid panel (which may, as always, be a rigid electrical panel and may be referred to as a splitter electrical panel). A rigid electrical panel may provide an electrical connection between a fan casing and an engine core. As explained elsewhere herein, one or more rigid panels may be attached to the engine core case or engine fan case, for example to a mounting structure on such cases.

With regard to rigid electrical panels, in general, transferring electrical signals using electrical conductors embedded in a rigid electrical panel can provide a number of advantages over transferring electrical signals using a conventional harness. For example, during assembly and in use, such panels may provide greater protection to their electrical conductors than conventional harnesses. Further, the use of such panels may significantly reduce the build and maintenance times of an engine, and/or reduce the possibility of errors occurring during such procedures. The panels can also provide weight and size advantages over conventional harnesses. Similar advantages accrue when fluids are transferred using an embedded fluid system of the rigid panel, for example in the form of fluid passages or pipes formed/embedded in the rigid material.

The rigid panel described and/or claimed herein may allow electrically conductive wires to be reliably and securely embedded in the rigid panel, whilst ensuring that the structural integrity of the panel is maintained/optimized. This may allow the weight and/or size of the panel to be optimized (for example minimized) for given structural requirements (for example in terms of strength and/or rigidity). The embedded electrical conductors may be used in a harness for a gas turbine. Some electrical conductors may be embedded in the form of electrical wires supported on the splint. Some electrical conductors may be embedded in the form of a flexible printed circuit, which may form the splint. Where both electrical wire(s) and flexible printed circuit(s) are provided, a design choice may determine which signals are transmitted by flexible printed circuit and which by electrical wire. For example, it may be possible to provide better fire protection to the electrical wire, and so those signals that require enhanced fire protection may be transferred by electrical wire in preference to flexible printed circuit.

In general, the use of one or more rigid rafts/panels may significantly reduce build time of an engine. For example, use of rigid rafts/panels may significantly reduce the part count involved in engine assembly compared with a conventional harness arrangement. The number and/or complexity of the operations required to assemble an engine (for example to assemble/install an electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical panels/electrical panel assemblies and/or flexible printed circuits, which themselves may be straightforward to handle, position, secure and connect. Thus, use of rigid panels in a gas turbine installation may reduce assembly time and/or reduce the possibility of errors occurring during assembly.

Use of rigid panels may provide significant advantages during maintenance, such as repair and overhaul. As discussed above, rigid panels may be particularly quick and straightforward to assemble to an engine. The same advantages discussed above in relation to assembly apply to disassembly/removal from the gas turbine engine. Thus, any repair/overhaul that requires removal of at least a part of a system, such as an electrical harness, may be simplified and/or speeded up through use of rigid panels, for example as at least a part of the electrical harness, for example compared with conventional harnesses. Use of rigid panels may allow maintenance procedures to be advantageously adapted. For example, some maintenance procedures may only require access to a certain portion of the gas turbine engine that only requires a part of a system (such as an electrical harness) to be removed. It may be difficult and/or time consuming, or not even possible, to only remove the required part of a conventional system (e.g. harness) from a gas turbine engine. However, it may be relatively straightforward to only remove the relevant rigid panel, for example by simply disconnecting it from the engine and any other panels/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of rigid panels (and optionally flexible printed circuits) prior to engine assembly. This may allow the electrical and/or mechanical operation of the panels to be proven before installation, thereby reducing/eliminating the testing required during engine installation.

Rigid electrical panels may be a particularly lightweight solution for transferring electrical signals around an engine. For example, they may be lighter, for example significantly lighter, than a conventional harness required to transmit a given number of electrical signals. A plurality of conductors may be embedded in a single electrical panel, whereas in a conventional arrangement a large number of heavy, bulky wires, usually with insulating sleeves, would be required. The reduced weight may be particularly advantageous, for example, when used on gas turbine engines on aircraft.

Rigid panels may be more easily packaged and/or more compact, for example than conventional harnesses. Indeed, as mentioned above, the panels can be made into a very wide range of shapes as desired. This may be achieved, for example, by manufacturing the panels using a mould conforming to the desired shape. As such, each panel may be shaped, for example, to turn through a tighter corner (or smaller bend radius) than a conventional harness. The panels may thus provide a particularly compact solution for transferring electrical signals around a gas turbine engine. The panels may be readily shaped to conform to neighbouring components/regions of a gas turbine engine, for example components/regions to which the panel is attached, such as a fan casing or a core casing as noted elsewhere herein.

A rigid panel may provide improved protection to embedded components (including the elongate element(s), which may be electrical conductor(s)) during manufacture/assembly of the panel/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the embedded system, for example compared with a conventional system, such as a conventional electrical system using only conventional harnesses.

Any components that are embedded in rigid panels, such as the supporting splint and/or the elongate element (which may be an electrical wire) and/or a flexible printed circuit, may be described as being fixed in position in the rigid panel, for example relative to the rest of the rigid panel. Embedded components may be said to be surrounded by rigid material and/or buried in rigid material and/or integral with (or integrated into) rigid material. In this context, rigid material may comprise the rigid structural layer and/or the covering layer.

Components/systems, for example of a gas turbine engine, may be provided to a rigid panel in any suitable manner. Thus, a surface of a rigid panel may be used as a mounting surface for other gas turbine engine components/systems, such as ancillary/auxiliary components/systems.

For example, an electrical unit may be mounted on a rigid panel. The electrical unit may be any sort of electrical unit, for example one that may be provided to a gas turbine engine. For example, the electrical unit may be any type of electronic control unit (ECU), such as an Electronic Engine Controller (EEC) and an Engine Health Monitoring Unit (EMU). Such an assembly may be a particularly convenient, lightweight and/or compact way of providing (for example attaching, fixing or mounting) an electrical unit to a turbine engine. For example, the electrical unit and the rigid panel may be assembled together (mechanically and/or electrically) before being installed on the gas turbine engine. Such an electrical unit may be connected to an outlet terminal that is connected to an electrical conductor embedded in the rigid panel, for example.

An rigid panel may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. The rigid panel may provide a stable, regular and convenient platform on which to mount the various systems/components. The combination of the installed rigid panel with components/systems mounted thereon may be much more compact and/or straightforward to assemble and/or have a greatly reduced number of component parts, for example compared with the corresponding conventional systems, such as electrical harness and separately mounted components/systems.

Such mounts may be used to attach any component/system to an rigid panel (and thus to the engine) as required. For example, fluid pipes for transferring fluid around the engine may be mounted to the rigid panels (for example mechanically mounted using a bracket), and thus to the engine. More than one set of fluid pipes, for example for carrying different or the same fluids, may be mounted on the same rigid panel.

An anti-vibration mount may be used to attach a rigid panel to another component, thereby allowing the rigid panel to be vibration isolated (or at least substantially vibration isolated). Using an anti-vibration mount to attach a rigid panel to a gas turbine engine for example may reduce (or substantially eliminate) the amount (for example the amplitude and/or the number/range of frequencies) of vibration being passed to the rigid panel from the gas turbine engine, for example during use. This may help to prolong the life of the rigid panel. Furthermore, any other components that may be attached to the rigid panel (as discussed above and elsewhere herein) may also benefit from being mounted to the gas turbine engine via the anti-vibration mounts, through being mounted on the rigid panel. For example, the reduced vibration may help to preserve an electrical contact between the panel and any electrical unit connected thereto. As such, any components (such as an electrical unit mounted to the electrical panel) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to a rigid raft/panel (for example to a mounting surface of the rigid panel), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

In use, the electrical signals transferred by any electrical conductors embedded in the rigid panel, and around the engine where the rigid panel is used as part of an electrical harness of a gas turbine engine, may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, embedded conductors may be used to transfer/communicate any possible combination of electrical signals in any part of a gas turbine engine installation or a related (for example electrically and/or mechanically connected) structure/component/system.

BRIEF DESCRIPTION OF THE DRAWINGS

Examples of the disclosure will now be described by way of non-limitative example with reference to the accompanying drawings in which.

DETAILED DESCRIPTION OF EMBODIMENTS

Figure 1:
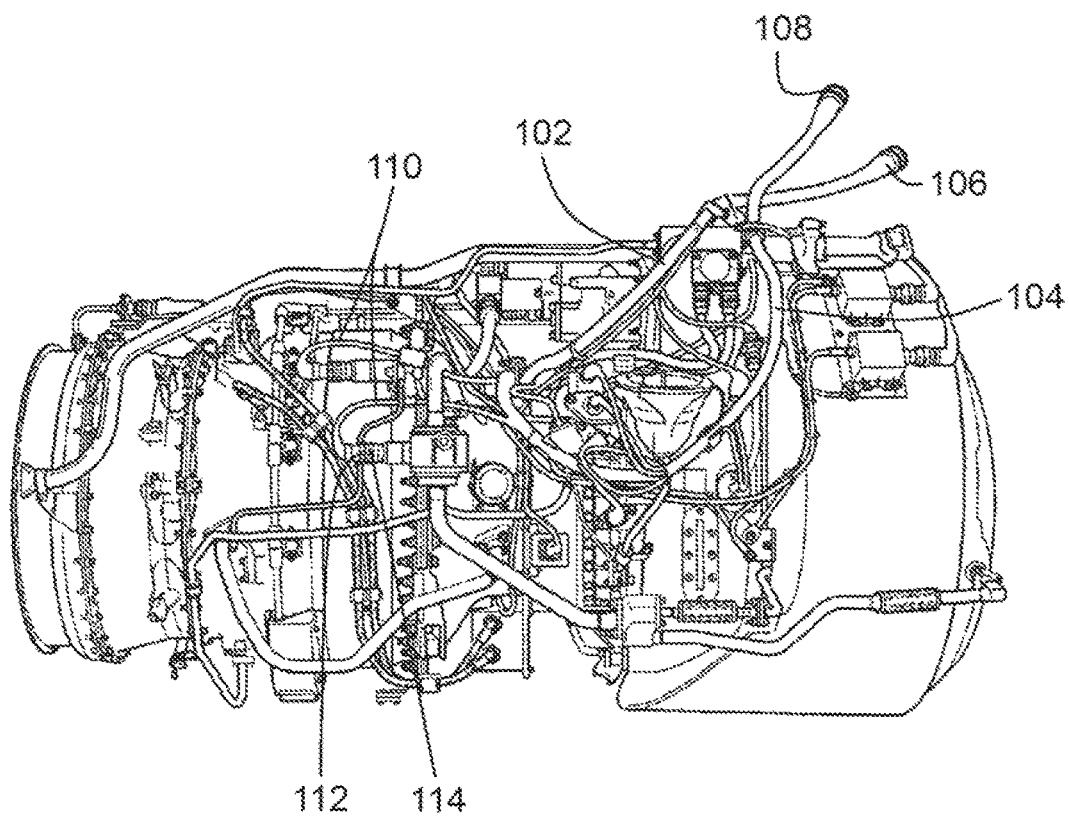
FIG. 1 shows a gas turbine engine with conventional engine dressings, including a conventional harness.
Figure 2:
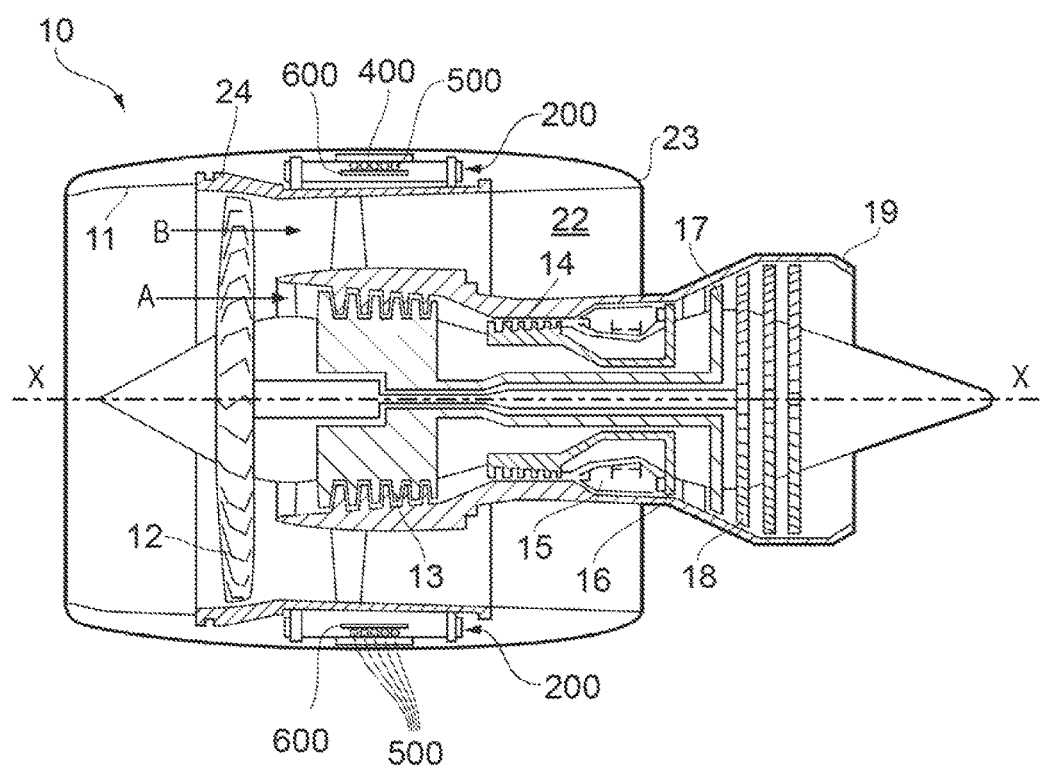
FIG. 2 shows a cross-section through a gas turbine engine having a rigid panel in accordance with the present disclosure.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 comprises at least two rigid panels 200 according to examples of the disclosure. As such, the gas turbine engine 10 is in accordance with the present disclosure.

Each rigid panel 200 comprises a supporting splint 600 embedded therein. Each rigid panel 200 comprises at least one elongate element 500 embedded therein. The rigid panels 200 shown in FIG. 2 are examples of rigid electrical panels, in which one or more of the elongate elements 500 comprise electrical wires. The supporting splint 600 may be a flexible printed circuit.

The rigid panels 200 may be used to transmit/transfer electrical signals (or electricity, including electrical power and/or electrical control signals) around the engine and/or to/from the engine 10 from other components, such as components of an airframe. The function and/or construction of each rigid panel 200 may be as described and/or claimed herein, for example in relation to FIG. 3.

Figure 3:
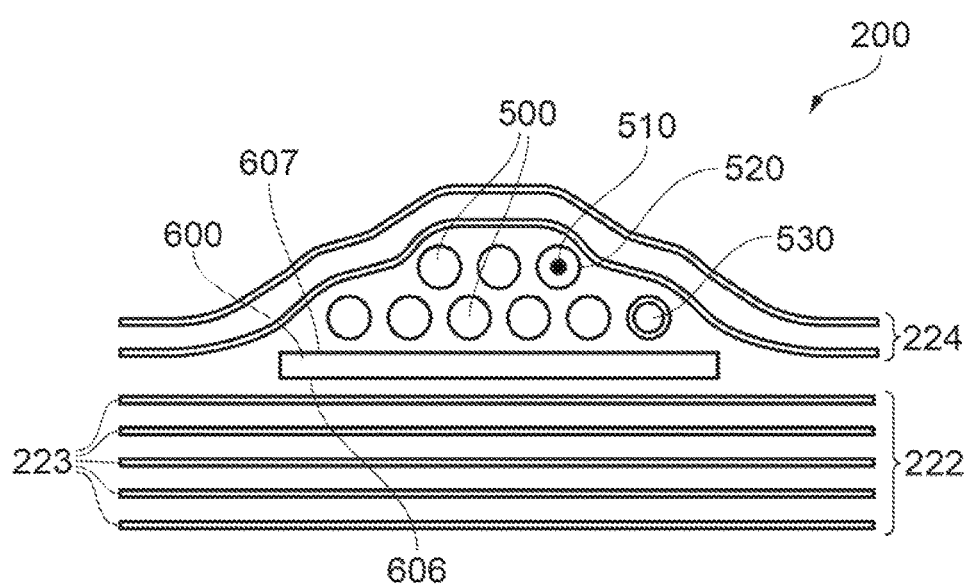
FIG. 3 shows a schematic cross-section through an example of a rigid panel in accordance with an example of the present disclosure.

The example of the rigid electrical panel 200 shown in FIG. 3 comprises a rigid structural layer 222. The rigid structural layer 222 may provide the structural requirements (for example in terms of stiffness and/or strength and/or rigidity) of the rigid panel 200. The rigid structural layer 222 may be a composite, for example an organic matrix composite, such as carbon fibre. The rigid structural layer 222 may comprise ply layers 223, as shown in the FIG. 3 example.

The rigid electrical panel 200 of the FIG. 3 example also comprises multiple elongate elements 500, at least some of which are in the form of electrical conductors 500. The term elongate in this context may be with reference to the direction perpendicular to the cross sectional view shown in FIG. 3. The electrical conductors 500 may be used to conduct/transfer electrical signals (including electrical power), for example around a gas turbine engine 10 and/or to/from components of a gas turbine engine 10.

The elongate elements 500 are separated from the rigid structural layer 222 by a supporting splint 600. The supporting splint 600 may offer protection to the rigid structural layer 222, for example from the stress/pressure concentration effects caused by the elongate elements 500. Such protection may be useful during normal use and/or during manufacture. For example, as explained elsewhere herein, manufacture of the rigid electrical panel 200 may comprise a curing step, during which the rigid structural layer 222 may be particularly susceptible to damage from the elongate elements 500.

The rigid electrical panel 200 also comprises a covering layer 224, which may be referred to as a cosmetic layer 224. The covering layer 224 may comprise any suitable material, such as polymer, which may or may not be reinforced, for example to form an organic matrix composite such as carbon fibre. The base layer 222 and the cosmetic layer 224 may be referred to, alone or in combination, as a rigid material 220 of the rigid electrical panel 200.

The elongate element 500 and the supporting splint 600 may be said to be embedded in the rigid panel 200, for example in the rigid material 220 of the rigid panel 200. The elongate element 500 and the supporting splint 600 may be said to be sandwiched between the base layer 222 and the cosmetic layer 224.

The electrical conductors 500 shown in FIG. 3 may comprise an electrically conductive wire 510. The electrically conductive wire 510 may be surrounded by a protective covering 520, which may be referred to as an insulator 520. The insulator 520 may provide electrical insulation to the electrical wire 510 and/or thermal protection, for example from the effects of fire. The electrical conductors 500 may be examples of fire protected elongate elements 500.

Although the elongate elements 500 in the example of FIG. 3 have been described by way of example as electrical conductors 500, it will be appreciated that the elongate elements 500 take any other suitable form. For example, one or more elongate element 500 may be a fire detection tube or wire arranged to detect fires, for example through a change in pressure and/or capacitance resulting from a temperature change. One or more of the elongate elements may be a fluid pipe (or conduit), as indicated by feature 530 in FIG. 3 by way of example. Of course, a rigid panel 200 may comprise any combination of any one or more types of elongate elements 500, including (by way of example) electrical wires 510 and/or fluid pipe(s) 530 and/or fire detection tubes.

Other examples of the elongate elements 500 include any component that may damage the rigid structural layer 222, for example during normal use or manufacture without the presence of the supporting splint 600.

The supporting splint 600 may take any suitable form. The supporting splint 600 may be sufficiently deformable to be able to follow the general shape of the rigid panel 200. The supporting splint 600 may also be sufficiently rigid to provide protection to the rigid structural layer 222. The supporting splint 600 may be a thin body of generally elongate form, having an upper major surface 607 and a lower major surface 606 separated by a thickness. In the example shown in FIGS. 4 and 5, the supporting splint 600 is deformable at least in a direction perpendicular to the major surface 606, 607 so as to be able to follow the general shape of the panel 200. The supporting splint 600 may be additionally of alternatively deformable about any other direction, and/or may be twisted about any direction.

The rigid panel 200 may comprise a flexible printed circuit. In some arrangements, the supporting splint 600 may be a flexible printed circuit. Such a flexible printed circuit 250 (which may or may not form the supporting splint 600) is shown and described in greater detail in relation to FIGS. 4 and 5.

The flexible printed circuit 250 typically comprises a flexible (for example elastically deformable) substrate 255 with conductive tracks 252 laid/formed therein. The flexible printed circuit 250 may thus be deformable. The flexible printed circuit 250 may be a thin body (in the z-direction shown in FIGS. 4 and 5) of generally elongate form (extending in the x-direction in FIGS. 4 and 5), having an upper major surface 257 and a lower major surface 256 separated by a thickness (in the z-direction). The flexible printed circuit 250 may be said to extend along a length in the x-direction, a width in the y-direction, and a thickness (or height or depth) in the z-direction. The x direction may be defined as the axial direction of the flexible printed circuit 250. Thus, the x-direction (and thus the z-direction) may change along the length of the flexible printed circuit 250 as it is deformed. The x-y surface(s) may be said to be the major surface(s) 256, 257 of the flexible printed circuit 250. In the example shown in FIGS. 4 and 5, the flexible printed circuit 250 is deformable in the z direction, i.e. in a direction perpendicular to the major surface 256, 257. Flexible printed circuits 250 may be additionally of alternatively deformable about any other direction, and/or may be twisted about any one or more of the x, y, or z directions.

The electrical tracks 252 are arranged in layers 253, 254, with each layer 253, 254 being substantially parallel to the upper and/or major surfaces 256, 257. A flexible printed circuit 250 may have any number of layers 253, 254 of electrical tracks 252, for example 1, 2 (as in the example of FIGS. 3 and 4), 3, 4, 5, or more than 5 layers 253, 254.

The flexible substrate 255 may be a dielectric. The conductive tracks 252, which may be said to be surrounded be the substrate 255, may be formed using a suitable conductive material. The conductive tracks 252 may be used to conduct/transfer electrical signals (including electrical power), for example around a gas turbine engine 10 and/or to/from components of a gas turbine engine 10. The size (for example the cross-sectional area) and/or the shape of the conductive tracks 252 may depend on the signal to be transmitted through the particular conductive track 252. Thus, the shape and/or size of the individual conductive tracks 252 may or may not be uniform in a flexible printed circuit 250.

Figure 4:
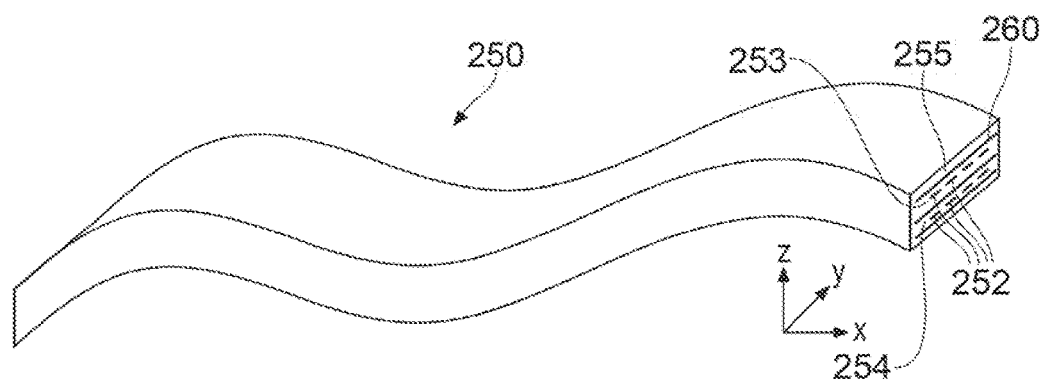
FIG. 4 shows a schematic perspective view of a portion of a flexible printed circuit.
Figure 5:
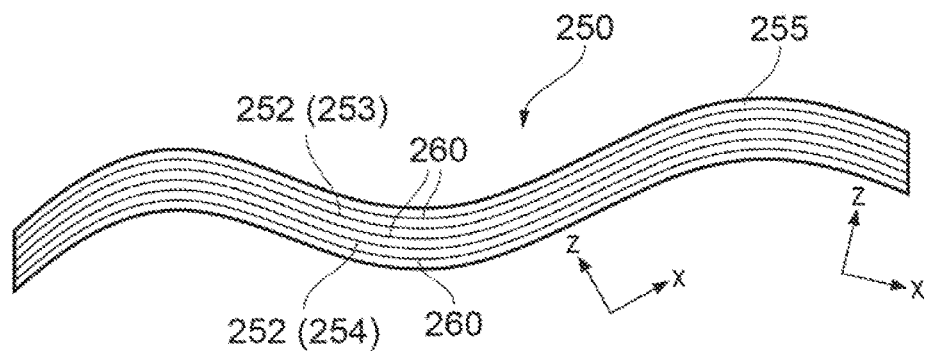
FIG. 5 shows a side view of the flexible printed circuit of FIG. 4.

The flexible printed circuit 250 may or may not comprise at least one integral electromagnetic shield 260, such as that shown in the example of FIGS. 4 and 5. The flexible printed circuit 250 may have an integral electromagnetic shield 260 adjacent one or both of the upper major surface 257 and the lower major surface 256. Each electrical track 252 may have at least one integral electromagnetic shield 260 between itself and one or both of the upper major surface 257 and the lower major surface 256.

The flexible printed circuit 250 may have any suitable number of integral electromagnetic shields 260 (including no integral electromagnetic shields 260). Each electromagnetic shield may be a conductive layer, such as a metallic layer. In the example of FIGS. 4 and 5, alternate layers of electrical tracks 252 and integral electromagnetic shield 260 are provided, but any other suitable arrangement may be used. For example, two, three, four, five or more than five layers of electrical tracks 252 may be provided between each electromagnetic shield 260 (where an electromagnetic shield 260 is present). Some arrangements may only have an electromagnetic shield adjacent one or both of the upper major surface 257 and the lower major surface 256. Where present, the or each integral electromagnetic shield 260 in the flexible printed circuit 250 may provide protection (or shielding) to the electrical tracks from electromagnetic interference. An integral electromagnetic shield 260 may help to provide shielding to high intensity radiated fields (HIRF), such as those produced by radar, TV signals and mobile phone signals, for example. Such an electromagnetic shield 260 may provide a degree of attenuation (or protection) against the effects of a lightning strike, for example providing a degree of protection against the secondary effects of lightning strike, such as cross-talk between electrical tracks/conductors.

It will be appreciated that a rigid panel 200 in accordance with the present disclosure may comprise no electrical conductors, or may comprise electrical conductors in the form of the elongate elements 500 and/or as part 252 of one or more flexible printed circuits 250. Where the rigid panel 200 comprises electrical conductors in the form of both electrical wires 500 and as conductors 252 in a flexible printed circuit 250, the determination of which signals to carry using the electrical wires 500/510 and which to carry in the flexible printed circuits 250 may be based on the relative properties of the flexible printed circuits 250 and the electrical wires 500. For example, the electrical wires may have better resistance to fire, in which case those signals that are required to continue to function under the conditions of a fire (as determined, for example, by airworthiness regulations) may be carried in the electrical wires 510 in preference to the flexible printed circuits 250. The electrical wires 510 may be specifically designed to comply with airworthiness requirements for fire protected signals.

Figure 6:
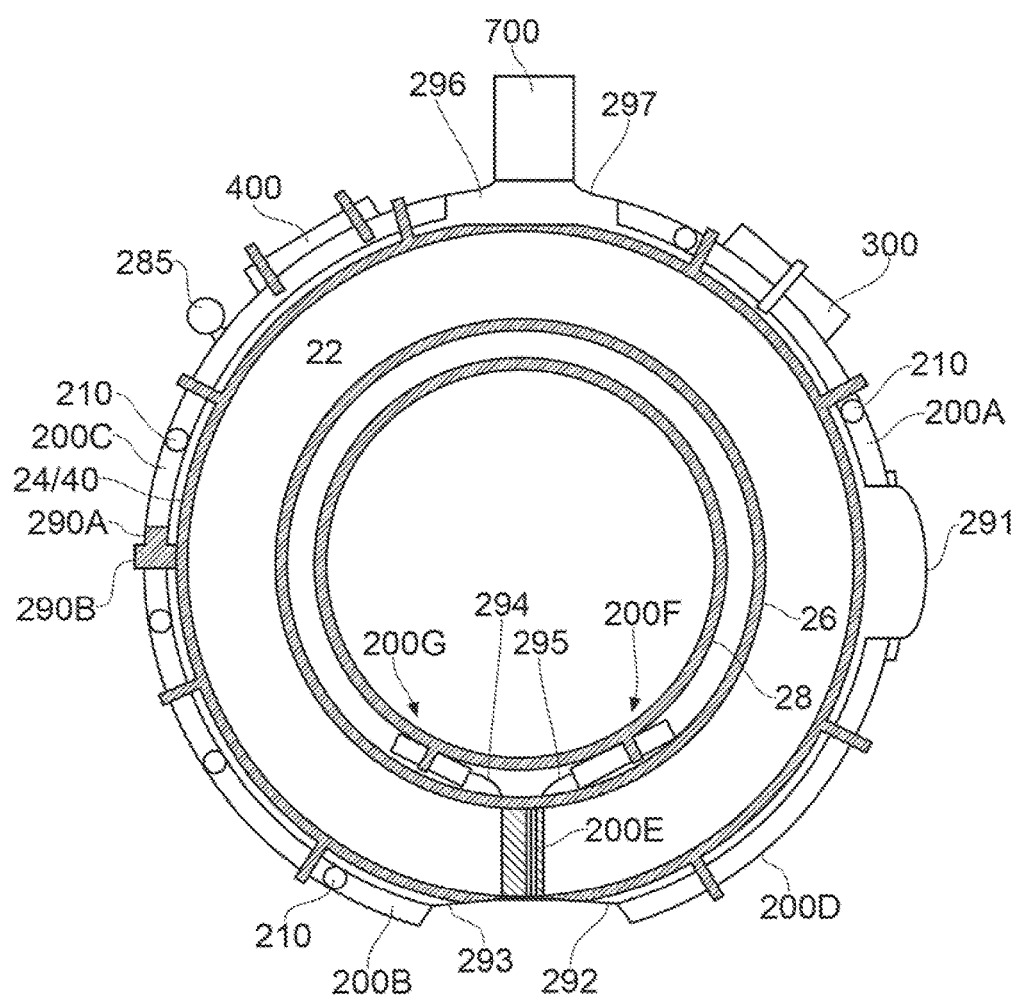
FIG. 6 shows a cross-section normal to the axial direction through a gas turbine engine having rigid panels in accordance with the present disclosure.

FIG. 6 is a schematic showing a cross-section perpendicular to the direction X-X of a gas turbine engine comprising rigid panels 200A-200G. Any one of the rigid panels 200A-200G may comprise any or all of the features of a rigid panel 200 as described and/or claimed herein, for example. Thus, for example, any one of the rigid panels 200A-200G may comprise a rigid structural layer 222, at least one elongate element 500 and a supporting splint 600. The detailed construction of the panels 200 is not shown in FIG. 6 for simplicity.

The rigid panels 200A-200D are mounted to a fan case 24/40, the rigid panel 200E is part of a bifurcation splitter that radially crosses a bypass duct 22, and the rigid panels 200F, 200G are mounted to an engine core case 28. However, it will be appreciated that a rigid panel 200 could be mounted in any suitable and/or desired location 22, 24, 26, 28 on a gas turbine engine 10.

In FIG. 6, two rigid panels 200A, 200C are shown as having an electrical unit 400 mounted thereon. However, any (or none) of the rigid panels 200A-200G may have an electrical unit 400 mounted thereon.

As mentioned herein, each of the rigid panels 200 shown in FIG. 6 comprises one or more elongate elements 500 embedded therein, which may be electrical conductors 500. Of course, as with any of the rigid panels 200 described and/or claimed herein, any of the rigid panels 200 of FIG. 6 may be rigid electrical panels 200. However, any one or more of the rigid panels 200 may be replaced with a panel that does not comprise elongate elements 500 Such a panel may otherwise be as described elsewhere herein, for example it may be a rigid panel that may have components/systems (such as, by way of example only, fluid systems, such as pipes) mounted thereon and/or embedded therein. Thus, for example, a gas turbine engine in accordance with the present invention may have a combination of rigid panels 200 (such as rigid electrical panels 200) as described and/or claimed herein, and panels that do not comprise the elongate elements 500 and/or supporting splints 600.

The arrangement of panels 200A-200G shown in FIG. 6 is by way of example only. Alternative arrangements, for example in terms of number, size, shape and/or positioning, of panels 200A-200G may be used. For example, there need not be seven panels 200, the panels may or may not be connected together, and the panels could be provided to (for example mounted on) any one or more components of the gas turbine engine 10. Purely by way of example only, connection between panels 200A-200D mounted on the fan casing 24 to the panels 200F, 200G mounted on the core casing 28 may be provided at least in part by means other than an additional panel 200E, for example using wire conductors with insulating sleeves. By way of further example, one or more panels 200 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 500 between the gas turbine engine 10 and an airframe (not shown).

Any one or more of the panels 200A-200G may have a fluid passage 210 embedded therein and/or provided thereto. The fluid passage 210 may be part of a fluid system, such as a gas (for example pneumatic or cooling gas/air) and/or liquid (for example a fuel, hydraulic and/or lubricant liquid). The fluid passage 210 may be one of the elongate elements 530, as described in relation to FIG. 3 for example. In the FIG. 6 example, three of the panels 200A-200C comprise a fluid passage 210 at least partially embedded therein. The panel 200C also has a fluid passage 285 (which may be for any fluid, such as those listed above in relation to embedded passage 210) mounted thereon. Such a mounted fluid passage 285 may be provided to any panel 200, such as those shown in FIG. 6. The fluid passages 210, 285 shown in FIG. 6 may be oriented in an axial direction of the engine 10. However, fluid passages 210, 285 may be oriented in any direction, for example axial, radial, circumferential or a combination thereof. Of course, rigid panels 200 comprising fluid passages 210 may be used in other applications outside a gas turbine engine 10.

Any of the panels 200A-200G may have any combination of mechanical, electrical and/or fluid connections to one or more (for example 2, 3, 4, 5 or more than 5) other components/systems of the gas turbine engine 10 and/or the rest of the gas turbine engine 10. Examples of such connections are shown in FIG. 6, and described below, but other connectors may be used. For example, panels 200 may be connected together (or to other components) using any combination of electrical, fluid and/or mechanical connectors. Thus, any of the connections 290A/290B, 291-297 shown in FIG. 6 may be any combination of electrical, fluid and/or mechanical connection. Alternatively, panels 200 may be standalone, and thus may have no connection to other panels or components.

A connection 291 is shown between the panels 200A-200D, and this connection may be via an electrical outlet terminal which may be connected either to electrical wire(s) 500 or a flexible printed circuit 250. The connection 291 may comprise an electrical connection. Such an electrical connection may be flexible and may, for example, take the form of a flexible printed circuit such as the flexible printed circuit 250. A connection 297 (which may be or comprise an electrical connection) is provided between the panel 200A and a part of an airframe, or airframe installation 700, which may, for example, be a pylon. Similarly, a fluid and/or mechanical connection 296 may additionally or alternatively be provided between the airframe 700 and another panel 200C. As shown in FIG. 6, other electrical and/or fluid connections 292, 293, 294, 295 may be provided between panels 200 and other components, such as other panels 200.

A direct connection 290A, 290B may be provided, as shown for example between the panels 200B, 200C. Such a direct connection 290A, 290B may comprise a connector 290A provided on (for example embedded in) one panel 200 connected to a complimentary connector 290B provided on (for example embedded in) another panel 200. Such a direct connection 290A, 290B may, for example, provide fluid and/or electrical connection between the two panels 200B, 200C. Such direct connectors 290A, 290B may be electrically connected to an embedded FPC 250 or an embedded wire 500.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term "gas turbine engine" as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Panels 200 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the scope of the invention.

For example, it will be appreciated that many alternative configurations and/or arrangements of panels 200, and gas turbine engines 10 comprising panels 200 other than those described herein may fall within the scope of the invention. For example, alternative arrangements of panels 200 (for example in terms of the arrangement, including number/shape/positioning/constructions, of mounting fixtures, the arrangement/shape/positioning/construction of the panels 200, the type and/or positioning of components (if any) mounted to/embedded in the panels 200, the rigid structural layer 222, the elongate elements 500 and the supporting splint 600) may fall within the scope of the invention and may be readily apparent to the skilled person from the disclosure provided herein. Alternative arrangements of connections (for example mechanical, electrical and/or fluid) between the electrical (or non-electrical) panels and/or assemblies thereof and between the electrical (or non-electrical) panels and/or assemblies thereof and other components may fall within the scope of the invention and may be readily apparent to the skilled person from the disclosure provided herein. Furthermore, any feature described and/or claimed herein may be combined with any other compatible feature described in relation to the same or another embodiment.

We claim:
1. A rigid panel comprising:
a rigid structural layer;
at least one elongate element;
a supporting splint positioned between the rigid structural layer and the at least one elongate element, the supporting splint being sufficiently rigid to substantially prevent local deformation caused by the at least one elongate element during conditions of a curing cycle; and
a covering layer positioned over the at least one elongate element such that the at least one elongate element and the supporting splint are sandwiched between the rigid structural layer and the covering layer.

2. The rigid panel according to claim 1, wherein the at least one elongate element comprises an electrically conductive wire.

3. The rigid electrical panel according to claim 1, wherein the at least one elongate element comprises an electrically conductive wire surrounded by an insulator.

4. The rigid panel according to claim 1, wherein the at least one elongate element comprises a pipe.

5. The rigid panel according to claim 1, further comprising a flexible printed circuit sandwiched between the rigid structural layer and the covering layer.

6. The rigid panel according to claim 1, wherein the supporting splint is sufficiently flexible that the supporting splint is able to follow a shape of the rigid structural layer.

7. The rigid panel according to claim 1, wherein the supporting splint is a flexible printed circuit.

8. The rigid panel according to claim 1, wherein the at least one elongate element is fire resistant.

9. The rigid panel according to claim 1, wherein the rigid structural layer comprises an organic matrix composite.

10. An electrical system for a gas turbine engine and/or vehicle comprising the rigid panel according to claim 2.

11. The electrical system according to claim 10, wherein:
the at least one elongate element is an insulated electrical wire arranged to carry electrical signals that are required to continue to operate the electrical system in the event of a fire; and
the rigid electrical panel comprises a flexible printed circuit.

12. A method of manufacturing the rigid panel according to claim 1, the method comprising:
providing an uncured organic matrix composite layer;
laying the supporting splint on top of the uncured organic matrix composite layer;
laying the at least one elongate element on top of the supporting splint;
covering at least the supporting splint and the at least one elongate element with a covering layer so as to sandwich the supporting splint and the at least one elongate element between the uncured organic matrix composite and the covering layer; and
curing the uncured organic matrix composite to form the rigid structural layer.

13. The method according to claim 12, wherein the supporting splint is a pre-cured organic matrix composite or plastic when the supporting splint is laid in position.

14. The method according to claim 12, further comprising laying a flexible printed circuit onto the uncured organic matrix composite before covering with the covering layer, the flexible printed circuit optionally forming the supporting splint, wherein the at least one elongate element comprises an electrically conductive wire.

15. A gas turbine engine and/or vehicle comprising the electrical system according to claim 10.

16. A rigid electrical panel for a gas turbine engine comprising:
a rigid structural layer;
at least one electrically conductive wire configured to carry one of a first set of electrical signals associated with an operation of the gas turbine engine;
at least one flexible printed circuit comprising electrical conductors configured to carry at least one of a second set of electrical signals associated with the operation of the gas turbine engine; and
a covering layer, wherein:
the at least one electrically conductive wire and the at least one flexible printed circuit are sandwiched between the rigid structural layer and the covering layer; and
the at least one electrically conductive wire is provided with better fire resistance than the electrical conductors of the at least one flexible printed circuit.

17. The rigid electrical panel according to claim 16, wherein:
the first set of electrical signals are critical to safe engine operation; and/or
each of the first set of electrical signals is carried by an electrically conductive wire.

18. The rigid electrical panel according to claim 16, wherein the at least one flexible printed circuit is positioned between the at least one electrically conductive wire and the rigid structural layer.

19. A gas turbine engine and/or vehicle comprising the rigid electrical panel according to claim 16.

* * * * *